July 5, 1960 R. E. RAWLINS 2,944,226

FREQUENCY MODULATION SIGNAL GENERATOR

Filed Nov. 10, 1954 2 Sheets-Sheet 1

INVENTOR.
ROBERT E. RAWLINS

BY George C. Sullivan

Agent

July 5, 1960 R. E. RAWLINS 2,944,226

FREQUENCY MODULATION SIGNAL GENERATOR

Filed Nov. 10, 1954 2 Sheets-Sheet 2

INVENTOR.
ROBERT E. RAWLINS
BY
George C. Sullivan
Agent 2,944,226

FREQUENCY MODULATION SIGNAL GENERATOR

Robert E. Rawlins, North Hollywood, Calif., assignor to Lockheed Aircraft Corporation, Burbank, Calif.

Filed Nov. 10, 1954, Ser. No. 467,976

2 Claims. (Cl. 332—19)

This invention relates, in general, to signal generators and, more particularly, to a frequency deviable oscillator which is controlled by a modulation input wherein the unmodulated carrier frequency of the oscillator is independent of the modulator characteristics. Thus the signal generator is readily adaptable to the use of many different kinds of modulators for a variety of different applications. In telemetering systems, for example, the device makes possible the automatic monitoring and recording of instrument data obtained at a remote point, such as from an aircraft under flight test.

An object of this invention is to provide a frequency deviable oscillator circuit which is stable in operation over long periods of time and for widely differing environmental conditions whereby the mid-band operating frequency of the oscillator is maintained nearly constant. Thus, a reliable indication of a modulation signal applied to the oscillator may be obtained in a form suitable for transmission by conventional communications equipment.

Another object of this invention is to provide a frequency modulation signal generator having a frequency deviable oscillator which is readily adaptable to operation over a wide range of frequencies and which is relatively insensitive to variations in the supply voltage.

Another object of this invention is to provide a frequency modulation signal generator which is capable of handling low level inputs from such transducer pickup elements as a thermocouple or a strain gauge, as well as high level inputs from transducers such as variable impedance modulators.

Another object of this invention is to provide a frequency modulation signal generator which maintains a high voltage level at all points in the oscillator circuit whereby a high signal to noise ratio is obtained.

Still another object of this invention is to provide a frequency modulation signal generator which is relatively insensitive to shock and vibration such as that occurring during flight.

Further and other objects will become apparent from a reading of the following detailed description, especially when considered together with the accompanying drawing, wherein like numerals refer to like parts.

Figure 1:
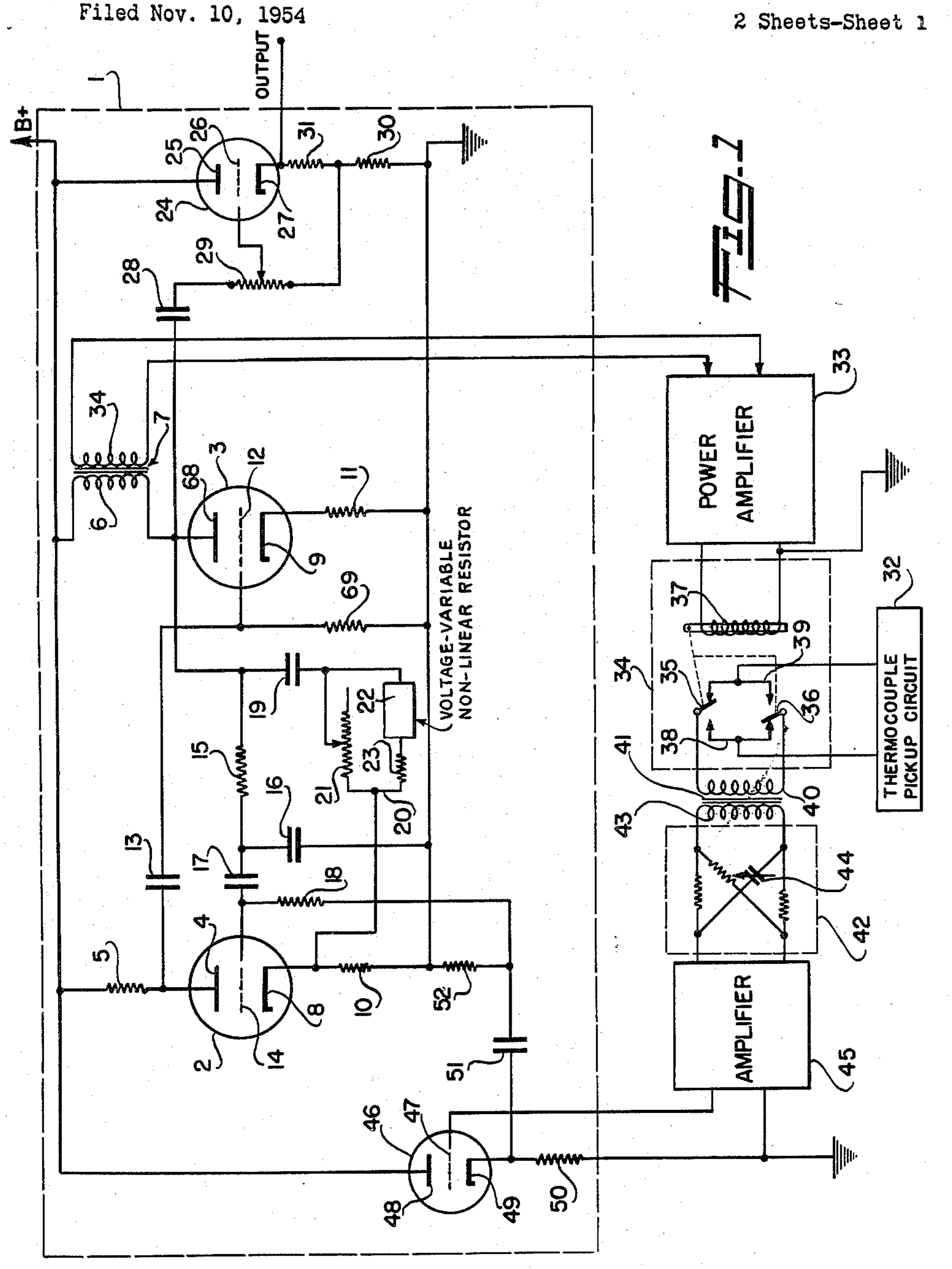
Figure 1 is a circuit diagram showing one form of the frequency modulation signal generator.

Referring to Figure 1, the frequency modulation signal generator includes a frequency deviable oscillator 1 having a pair of triode vacuum tube amplifiers 2 and 3. Plate 4 of tube 2 connects with a suitable source of electrical potential identified as B+ through a load resistor 5.

Plate 68 of tube 3 connects with B+ through the primary winding 6 of a transformer 7. Cathode 8 of tube 2 connects with ground through load resistor 10 and cathode 9 of tube 3 connects with ground through load resistor 11. Plate 4 of tube 2 connects with grid 12 of tube 3 through a coupling condenser 13. A D.C. return is provided for grid 12 through biasing resistor 69. Plate 68 of tube 3 connects with grid 14 of tube 2 through a two-section resistor-capacitor phase network which controls the center-band frequency of oscillation by phase shifting the signal applied to the grid. One section of the phase network is made up of a series connected resistor 15 and a parallel connected condenser 16 which causes the phase angle of the voltage at the output of the section to lead the applied voltage an amount which is a function of frequency. The other section of the phase network comprises a series connected condenser 17 and a parallel connected resistor 18 which causes the phase angle of the voltage at its output to lag the applied voltage an amount which is a function of frequency. The time constant for each of the resistor-condenser sections in the phase network determines the center-band frequency of oscillation $F_0$ according to the equation $$F_0 = \frac{1}{2\pi\sqrt{T_1 T_2}}$$

where $T_1$ is the time constant for the resistor 15 condenser 16 combination and $T_2$ is the time constant for the condenser 17 resistor 18 combination. The frequency at which the net phase shift from both sections of the phase network is zero is the normal operating frequency of the oscillator.

To control and stabilize the amplitude of oscillation, a degenerative feedback loop is employed between plate 68 of tube 3 and cathode 8 of tube 2. This feedback loop includes a coupling condenser 19, which serves a blocking function to keep B+ off cathode 8, and a parallel voltage regulating resistance circuit 20. One leg of circuit 20 contains a variable resistor 21, the value of which is chosen to provide the desired amplitude of oscillation. The other leg of resistance circuit 20 contains a nonlinear resistance element 22 and a series connected resistor 23. The nonlinear resistance element provides cycle by cycle amplitude control and has a characteristic such that the current through it varies exponentially with the applied voltage. Such a device is obtainable from any of several suppliers. For example, the General Electric Company markets such a device under the trade name "thyrite." If the amplitude of the signal at plate 68 of tube 3 tends to increase, the resistance of element 22 decreases and vice versa. This increases the inverse feedback or decreases the inverse feedback, depending upon the direction of the change in magnitude of the signal at plate 68, and thereby stabilizes the amplitude of the oscillator output. Series resistor 23 has the purpose of limiting the effectiveness of element 22 by decreasing the exponent so that the wave form distortion thereby introduced is made negligible.

The frequency modulated output signal of the oscillator, which appears at plate 68 of tube 3, exhibits excellent zero-drift stability. This is primarily due to the high voltage operating level maintained in the oscillator and to the large amount of negative feedback which is applied to cathode 8 of tube 2, as provided by the coupling circuit between amplifier tubes 2 and 3.

Cathode follower 24 is employed to isolate the oscillator and allow it to operate independently of the external circuitry. Plate 25 of cathode follower 24 connects with B+ while grid 26 and cathode 27 connect with plate 68 through a blocking condenser 28. The low impedance output of the oscillator is obtained at cathode 27. A variable resistor 29 is provided in the cathode follower circuit to control the voltage level on grid 26 and hence the output level of the tube. Resistor 30 serves as a D.C. return for grid 26 and resistor 31, in combination with resistor 29, serves as a means for loading cathode 27.

Frequency modulation of the oscillator is effected by an external loop which provides an alternating current voltage, the amplitude of which is proportional to the magnitude of the modulating signal and the frequency of which is equal to the operating frequency of the oscillator. Figure 1 of the drawing shows one form of invention for use with a low level D.C. modulating voltage such as that obtained from a thermocouple pickup transducer 32. In this form of the invention a suitable power amplifier 33 receives the oscillator output signal through secondary coil 34 of transformer 7 in the plate circuit of tube 3. The power level of the oscillator output signal is thereby increased a sufficient amount to drive a chopper modulator 34. A pair of switch arms 35 and 36, in the chopper modulator, are mechanically driven by a magnetically polarized solenoid operated relay 37 which is controlled by the power amplifier output. Two pairs of contact members 38 and 39 are arranged to complete a circuit from transducer 32 to the primary winding 40 of a coupling transformer 41 in such a manner as to reverse the polarity of the current flow through secondary coil 40 as switch arms 35 and 36 move from one of the pairs of contact elements 38 or 39 to the other. In this manner the D.C. modulating voltage is converted to a square wave A.C. voltage, the frequency of which is equal to the output frequency of the oscillator as applied to the chopper through power amplifier 33. Coupling transformer 41 applies the square wave modulating signal to a phase shifter such as an all pass, half lattice type phase shift network 42 through secondary coil 43. By the adjustment of capacitor 34 the phase of the square wave modulating signal may be shifted to provde the desired relationship for the modulating signal, as hereinafter described, for frequency modulating the oscillator.

Since the voltage level of the output of transducer 32 is small, the square wave modulating signal from phase shifter 42 is applied to an amplifier 45 for increasing the signal level to a value sufficient for driving a cathode follower 46 and modulating the oscillator linearly over the required operating bandwidth. The output of amplifier 45 is applied to grid 47 of tube 46 for controlling current flow therethrough. Plate 48 of tube 46 connects with B+ and cathode 49 connects with ground through resistor 50. The output of cathode follower 46 is obtained at cathode 49 and applied to resistor 18 in the oscillator circuit through capacitor 51. This connection of the cathode follower output with resistor 18 in the coupling circuit of the oscillator completes the external modulating feedback loop. The modulating signal voltage is combined with the signal at the output end of the two section phase network and applied to grid 14 of tube 2. As hereinafter described, the magnitude of the modulation signal shifts the phase of the signal applied to grid 14 and thereby effects frequency modulation of the oscillator. A D.C. return for grid 14 is provided by resistor 52.

Figure 2:
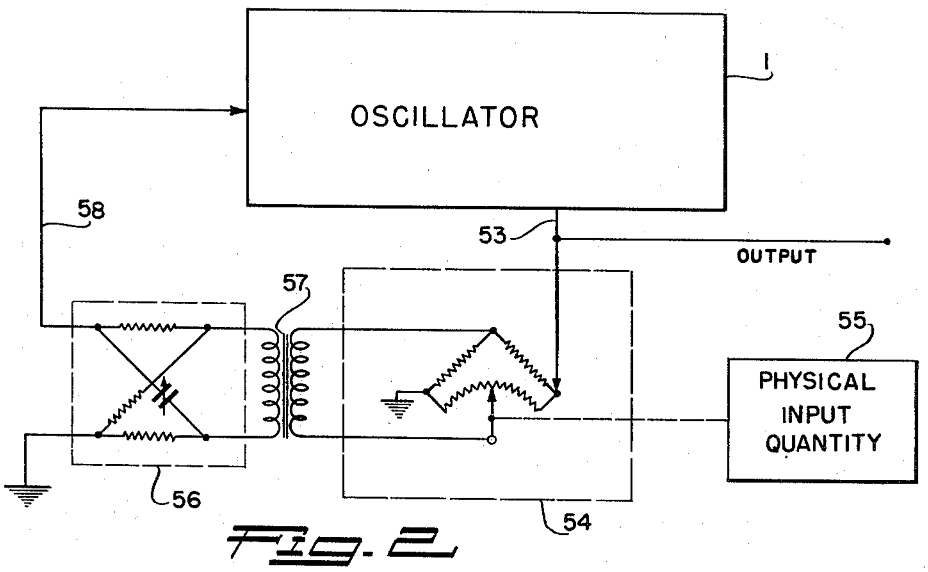
Figure 2 is a schematic circuit diagram showing a second form of the frequency modulation signal generator.

A second form of the invention is shown in Figure 2 wherein the signal generator is adapted for use in measuring physical input quantities such as pressure or strain. In Figure 2, the oscillator output 53 is applied to a resistance bridge circuit modulator 54 to serve as a carrier voltage for the bridge network. The physical input quantity 55 mechanically adjusts the bridge circuit to provide a voltage level which is proportional to the physical input quantity. The output of the bridge type modulator 54 is applied to a phase shift network 56 through a coupling transformer 57. Phase shift network 56 is shown as being identical to the phase shift network 42 in Figure 1, however it should be recognized that any conventional type of phase shift network may be employed, depending upon specific design preferences. Output 58 from phase shift network 55 is applied directly to oscillator 1 to complete the external feedback loop. Where a high level transducer is employed, such as that shown in Figure 2, amplification of the modulating signal applied to oscillator 1 is not necessary, however, where a low level transducer such as a strain gauge is used, it may be necessary to employ an amplifier in the feedback loop, such as is shown in Figure 1.

Figure 3:
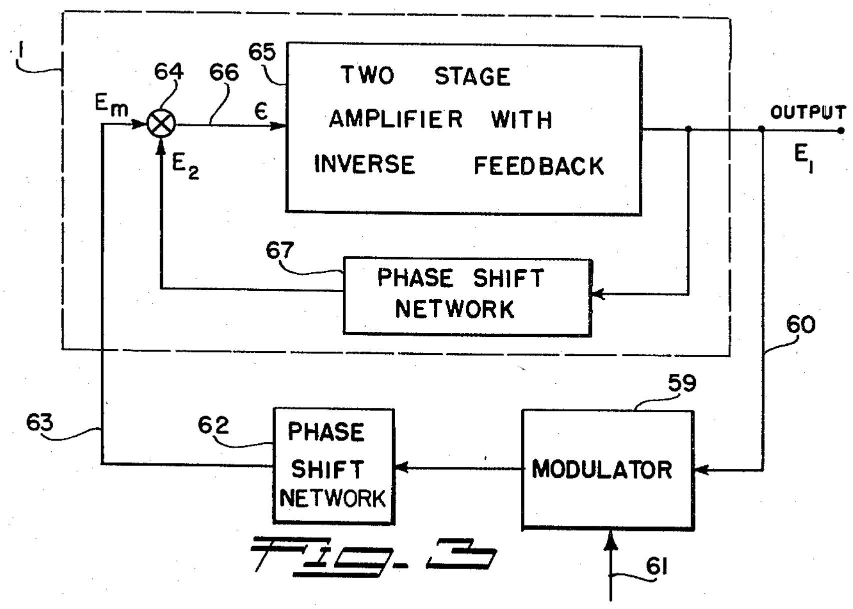
Figure 3 is a block diagram of the signal generator illustrating the theory of operation.

The block diagram of Figure 3 illustrates the theory of operation of the frequency modulation signal generator and it is applicable to both forms of the invention as shown by Figures 1 and 2. Oscillator 1 supplies the carrier voltage $E_1$ to modulator 59 through lead 60. The output of the modulator, the voltage level of which is proportional to the input quantity 61 and the frequency of which is equal to the oscillator frequency, is applied to the phase shift network 62. The output $E_m$ of phase shift network 62 is fed to oscillator 1 through lead 63 and mixed with the output $E_2$ from the oscillator phase shift network 67 at the summing point 64. The vector sum of $E_2$ and $E_m$ is obtained at the summing point to provide a voltage $\epsilon$ which is applied to the two stage oscillator-amplifier 65 through lead 66. Two stage oscillator-amplifier 65 represents tubes 2 and 3 in Figure 1 wherein the $\epsilon$ voltage is that which is applied to grid 14 of tube 2.

Figure 4:
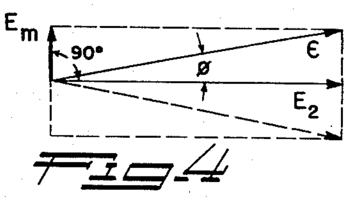
Figure 4 is a vector diagram showing how the frequency modulation is accomplished.

The vector diagram in Figure 4 shows how the frequency modulation is accomplished. The phase of the modulating voltage $E_m$ is adjusted by phase network 62 to be approximately 90° with respect to the phase of the oscillator voltage $E_2$ at the summing point 64. The voltage $\epsilon$, which is the vector summation $E_m$ and $E_2$ is shifted in phase by an amount $\phi$ which is proportional to the arctan of $$\left|\frac{E_m}{E_2}\right|$$

Since, in normal applications for the circuit shown, the magnitude of $$\frac{E_m}{E_2}$$

is very small compared to unity, the phase shift of $\epsilon$ is very nearly proportional to $$\left|\frac{E_m}{E_2}\right|$$

Also, the frequency of oscillation must shift in proportion to the ratio $$\frac{E_m}{E_2}$$

in order to maintain the zero phase relationship between $\epsilon$ and $E_1$ that is required to sustain the oscillation. Therefore, since the magnitude of $$\frac{E_m}{E_2}$$

is proportional to the input quantity from the modulator, the frequency deviation from the center frequency is a measure of the magnitude of the input quantity.

It should be recognized that the signal generator is operable even where $$\frac{E_m}{E_2}$$

is not small compared to unity by the use of networks which actually obtain the arctan of $$\left|\frac{E_m}{E_2}\right|$$

or when the non-linearity of the output is acceptable.

In operation, the signal generated by the frequency deviable oscillator is applied to the modulator in the external feedback loop. As the condition under measurement varies, the modulator output voltage is varied in amplitude proportionately. The modulating voltage is applied to a phase shifter, amplified if necessary, and then applied to the oscillator through a cathode follower. The actual frequency modulation is accomplished by phase shifting the oscillator plate to grid feedback signal in accordance with the amplitude of the modulating voltage.

The circuits shown in Figures 1 and 2 are intended to illustrate the invention using two basic modulator types, one which accommodates an electrical input for modulation and the other which accommodates a physical input for modulation. Obviously any special type of modulator may be employed in the external feedback circuit of the signal generator without departing from the teachings of the invention. Also the use of amplifiers, and the like, in the external feedback loop, may or may not be used according to the requirements of a specific design without departing from the teachings of the invention.

It is to be understood that certain alterations, modifications and substitutions, such as those mentioned hereinabove, may be made to the instant disclosure without departing from the spirit and scope of the invention as defined by the appended claims.

I claim:

1. A frequency modulation signal generator comprising, first and second electron tubes each having an anode, a cathode and a control electrode, means applying a voltage to the anodes of said tubes for effecting current flow therethrough, the anode of said first tube being coupled to the control electrode of the second tube, phase shifting means coupling the anode of the second tube with the control electrode of said first tube and inducing oscillations in the current flow therethrough at a frequency controlled by the phase shift means, degenerative feedback means coupling the anode of the second tube with the cathode of said first tube and stabilizing the amplitude of the oscillations, a modulator responsive to the anode voltage of the second tube and to a modulation input and producing an alternating current modulating signal, the magnitude of which is proportional to the modulation input and the frequency of which is substantially equal to the frequency of the oscillations, and a second phase shifting means receiving the modulating signal and applying the same to the control electrode of the first tube substantially 90 degrees out of phase with the signal applied thereto through the first mentioned phase shifting means whereby the magnitude of the modulating signal effects a proportional change in the frequency of the oscillations produced by the first and second electron tubes.

2. A signal generator responsive to an externally applied direct current voltage for producing a frequency modulated output signal representing the magnitude of the applied voltage comprising, first and second electron tubes, each said tube including an anode, a cathode and a control electrode, means applying a voltage to the anodes of said tubes for effecting current flow therethrough, the anode of said first tube being coupled to the control electrode of the second tube, a plural section resistor-capacitor phase shift network coupling the anode of said second tube with the control electrode of said first tube, one section of said phase shift network effecting a phase lead in the signal applied thereto and a second section of the phase shift network effecting a phase lag in the signal applied thereto whereby zero phase shift is obtained through the network at a predetermined signal frequency whereby said tubes are normally caused to alternately conduct and generate oscillations at the predetermined signal frequency, degenerative feedback means coupling the anode of the second tube with a cathode of said first tube and stabilizing the amplitude of the oscillations, a modulator responsive to the anode voltage of the second tube and to a modulation input and producing an alternating current modulating signal, the magnitude of which is proportional to the modulation input and the frequency of which is substantially equal to the frequency of the oscillations, and a second phase shift network receiving the modulating signal and applying the same to the control electrode of the first tube substantially 90° out of phase with the signal applied thereto through the first mentioned phase shift network whereby the magnitude of the modulating signal effects a proportional change in the frequency of the oscillations produced by the first and second electron tubes.

References Cited in the file of this patent

UNITED STATES PATENTS

| | | |
|---|---|---|
| 2,218,526 | De Lange | Oct. 22, 1940 |
| 2,496,148 | Butts | Jan. 31, 1950 |
| 2,498,759 | Korman | Feb. 28, 1950 |
| 2,506,329 | Ames | May 2, 1950 |
| 2,568,868 | Pratt | Sept. 25, 1951 |
| 2,611,873 | Gager et al. | Sept. 23, 1952 |
| 2,814,020 | Bouwman et al. | Nov. 19, 1957 |